United States Patent [19]

Scharnhorst et al.

[11] 3,961,998

[45] June 8, 1976

[54] VACUUM DEPOSITION METHOD FOR FABRICATING AN EPITAXIAL PbSnTe RECTIFYING METAL SEMICONDUCTOR CONTACT PHOTODETECTOR

[75] Inventors: Kurt Peter Scharnhorst, Beltsville; Richard F. Bis, Mount Airy; Jack R. Dixon, Silver Spring; Bland B. Houston, Jr., Silver Spring; Richard W. Brown, Silver Spring; Harold R. Riedl, Adelphi, all of Md.

[73] Assignee: The United States of America as represented by the Secretary of the Navy, Washington, D.C.

[22] Filed: Apr. 9, 1975

[21] Appl. No.: 566,461

[52] U.S. Cl. .................. 148/175; 29/572; 136/89; 250/211 J; 252/62.3 V; 357/15; 357/30
[51] Int. Cl.² ............... H01L 21/363; H01L 27/14; H01L 31/00
[58] Field of Search ............. 148/175; 136/89; 357/30, 15; 156/610; 250/211 J; 252/62.3 V; 29/572

[56] References Cited
UNITED STATES PATENTS

| | | | |
|---|---|---|---|
| 2,820,841 | 1/1958 | Carlson et al. | 136/89 |
| 3,716,424 | 2/1973 | Schoolar | 148/175 |
| 3,742,223 | 6/1973 | Carr et al. | 250/211 J |
| 3,757,123 | 9/1973 | Archer et al. | 357/30 X |
| 3,770,565 | 11/1973 | Schoolar et al. | 148/175 X |
| 3,779,801 | 12/1973 | Halloway et al. | 148/175 X |
| 3,793,070 | 2/1974 | Schoolar | 148/175 X |
| 3,799,803 | 3/1974 | Kraus et al. | 357/30 X |

OTHER PUBLICATIONS

Zemel et al., "Electrical and Optical Properties .... PbTe and SnTe" Physical Rev., vol. 140, Oct. 4, 1965, pp. A330–A342.

Nill et al., "Laser Emission From .... $Pb_{0.8}Sn_{0.2}Te$" Applied Physics Letters, vol. 16, No. 10, May 15, 1970, pp. 375–377.

Logothetis et al., "Photoconductivity in Epitaxial $Pb_{1-x}Sn_xTe$" J. Appl. Phys., vol. 43, No. 1, Jan. 1972, pp. 256–257.

Bis et al., "Thick Epitaxial Films of $Pb_{1-x}Sm_xTe$" J. Vacuum Science & Tech., vol. 9, No. 1, 1972, pp. 226–230.

Primary Examiner—L. Dewayne Rutledge
Assistant Examiner—W. G. Saba
Attorney, Agent, or Firm—R. S. Sciascia; J. A. Cooke; W. W. Cochran

[57] ABSTRACT

A junction photodetector employing $Pb_{1-x}Sn_xTe$ in narrow film strips grown epitaxially on an appropriate substrate. An appropriate metal overlaps the film to form a metal-semiconductor contact.

15 Claims, 2 Drawing Figures

VACUUM DEPOSITION METHOD FOR FABRICATING AN EPITAXIAL PBSNTE RECTIFYING METAL SEMICONDUCTOR CONTACT PHOTODETECTOR

BACKGROUND OF THE INVENTION

The present invention pertains generally to methods for constructing infrared detectors and more particularly to methods for constructing epitaxial film, metal contact infrared detectors (including Schottky barrier detectors) sensitive to radiation in the 8–14 microns atmospheric window of the electromagnetic spectrum.

Various methods exist for constructing semiconductor junctions-detectors which are responsive to electromagnetic radiation. A common method uses bulk material and a number of complex photolithographic steps to form junctions which run parallel to the semiconductor surface. Structures formed by this method are constructed such that they must be mechanically self-supporting. Their resulting relative massiveness makes it difficult to obtain efficient radiation exposure of their junctions.

Epitaxial films have been used to alleviate some of the problems posed by bulk detectors. Epitaxial films are grown in single crystalline structures on crystalline substrates, such as barium fluoride, by various evaporation techniques. Compared with etched bulk materials, these epitaxial films provide relatively thin semiconductor layers. The films, in addition, solve the radiation exposure or quantum efficiency problems, by allowing radiation to enter the semiconductor film through a non-absorbing substrate, whereas in bulk material the radiation enters through a thick layer of semiconductor material. Epitaxial films have, of course, been grown by various techniques. However, the quasiequilibrium technique (cool method) for growing films as disclosed in an article entitled "Thick Epitaxial Films of $Pb_{1-x}Sn_xTe$" in The Journal of Vacuum Science and Technology, Vol. 9, No. 1, pp. 226–230, by R. F. Bis, J. R. Dixon and J. R. Lowney has been proven to be a superior method for growing epitaxial films. Epitaxial films formed by this technique adhere firmly to the substrate facilitating handling and creating a generally more durable device. In addition, the electrical properties of the films can be controlled effectively during growth, making costly and time consuming post growth treatments largely unnecessary.

Schottky barrier devices have been developed to detect infrared radiation which have utilized the conventional complex and time consuming evaporation techniques for growing epitaxial films. The further step of formation of Schottky barriers on films grown by the conventional techniques certainly has not proved to be a simplier or less costly procedure.

Schottky barrier detectors have also been constructed with epitaxial film layers of $Pb_{1-x}Sn_xTe$ formed by techniques similar to quasiequilibrium technique but have relied on electroplating rather than evaporation methods to form the detector metal-semiconductor junction. However, electroplating requires breaking of the vacuum after depositing the epitaxial film and exposing the surface of the film to potentially contaminating gas-ambients. Exposing the semiconductor to ambient gases after growth, runs the risk of degrading the electro-optical properties of the metal semiconductor contact to be formed, hence degrading the performance of the device.

SUMMARY OF THE INVENTION

The present invention overcomes the disadvantages and limitations of the prior art by providing a method for constructing an improved thick epitaxial film $Pb_{1-x}Sn_xTe$ or $Pb_{1-x}Sn_xSe$ Schottky barrier detector. The present invention discloses a method whereby epitaxial films are grown on a $BaF_2$ crystalline substrate by the "quasiequilibrium" technique referred to above, to create a Schottky barrier detector sensitive to electromagnetic radiation having wavelengths ranging from 8 to 14 microns. Strips of indium (In) are used as the metal electrode and are deposited on the epitaxial film by thermal evaporation techniques without breaking the vacuum so as to preserve the quality of the metal-semiconductor interface. This creates a device which has all the advantages of an epitaxial exposure to radiation, without the complex problems of fabrication requiring special handling as, e.g. those faced in photolithography methods.

It is therefore an object of the present invention to provide an improved method for constructing infrared detectors.

It is also an object of the present invention to provide an improved method for constructing infrared detectors responsive to radiation having wavelengths ranging from 8 to 14 microns.

Another object of the present invention is to provide an inexpensive, simple, and reliable method for producing photovoltaic infrared detectors.

Other objects, advantages and novel features of the invention will become apparent from the following detailed description of the invention when considered in conjunction with the accompanying drawings wherein:

DETAILED DESCRIPTION OF THE PREFERRED EMBODIMENT

Figure 1:
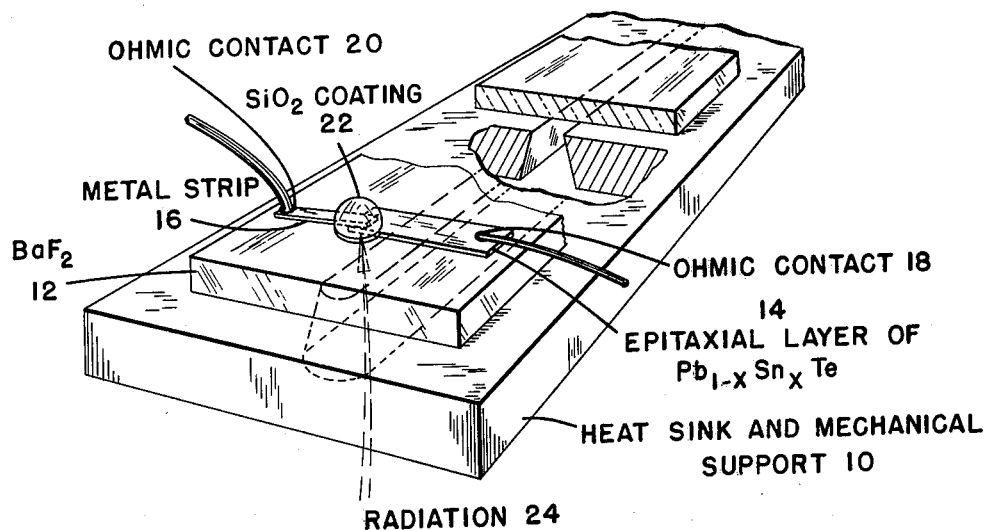
FIG. 1 is a schematic drawing of a single detector junction.

FIG. 1 discloses a single detector produced by the method of the preferred embodiment. A crystalline layer 12 of $BaF_2$ is utilized as a substrate. The semiconducting material 14 which is used in an alloy of lead-tin-telluride ($Pb_{1-x}Sn_xTe$) or lead tin selenide ($Pb_{1-x}Sn_xSe$) or mixtures thereof where x is a value selected for detecting 8 to 14 micron wavelength electromagnetic radiation. The semiconducting material is grown as an epitaxial film layer 14 on the $BaF_2$ substrate by an evaporation method referred to as the "quasiequilibrium" technique as disclosed in the above mentioned article by Bis, Dixon, and Lowney. This technique creates epitaxial film up to 20 times thicker than those produced by conventional thermal evaporation techniques of comparable quality. The thicker films are not only more durable, but are found to bond more securely to the substrate 12 without cracking or peeling and allow attachment of ohmic contact 20 more readily. The films are grown through vapor masks placed on the substrate 12 as to deliniate the geometrical configuration of the $Pb_{1-x}Sn_xTe$ film of the detector or detector array. Growth through a vapor mask makes the use of photolithography unnecessary.

Once the epitaxial layer 14 is grown on the substrate, a strip of metal 16 such as indium (In) lead (Pb), or tin (Sn) is thermally evaporated through appropriate masks so as to overlap the epitaxial layer 14 to form a photovoltaic metal-semiconductor interface. It is not presently known whether, when examined on a microscopic level, this interface is a Schottky barrier, a diffused metal junction, or a combination of the two. The metal strip also serves as an electrical contact 20 for the detector. The strip of metal should preferably be deposited immediately after the epitaxial layer 14 has cooled to room temperature or below following its growth heat treatment in high vacuum and without exposing the epitaxial layer to ambient gases (without breaking vacuum). This preserves the quality of the surface of the epitaxial layer 14 for disposition of the indium strip 16. A layer 22 of $SiO_2$ is then deposited by thermal evaporation on the entire sandwich structure without breaking vacuum to protect it from the atmosphere.

The junction between the metal (In) and the semiconductor ($Pb_{1-x}Sn_xTe$) so defined constitutes a radiation detector which is sensitive to wavelengths between 8 and 14 microns with the appropriate choice of X (e.g. X = 0.2). The second ohmic electrical contact 18 is placed on the PbSnTe itself. It is a thermally evaporated gold contact.

The sandwich structure and substrate 12 are then bonded to the heat sink 10 with a high thermally conducting epoxy. Since the $BaF_2$ substrate 12 is transparent to 8–14 micron radiation, the radiation 24 can enter the epitaxial semiconductor through the substrate and through the cutaway portion of the heat sink 10 as shown in FIG. 1. The back of the substrate 12 at the interface between the substrate 12 and the heat sink 10 is metalized and shaped so as to trap radiation and reflect it back to the detector sandwich.

Figure 2:
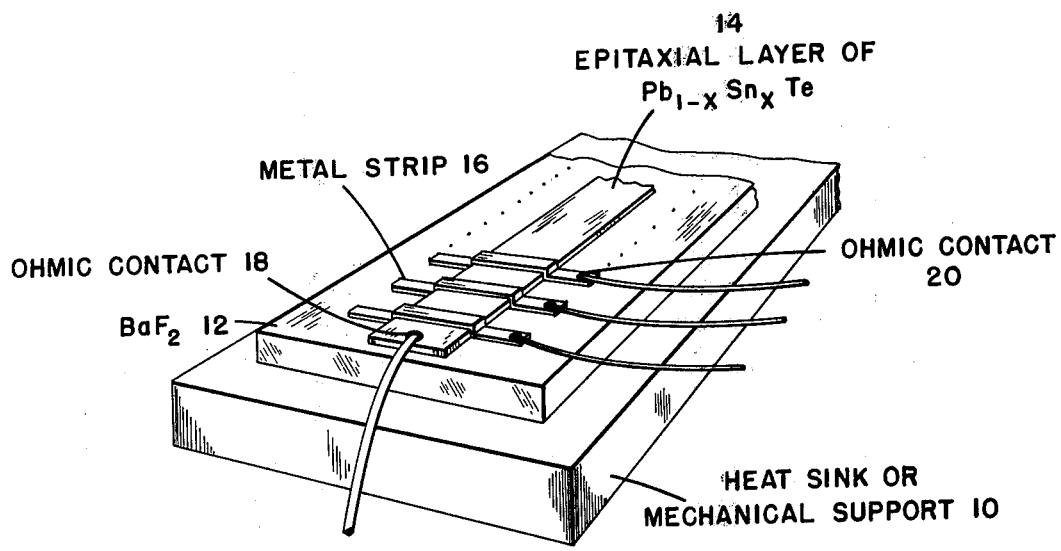
FIG. 2 is a schematic drawing of a linear array of detector junctions.

A series of detectors forming a linear array is shown in FIG. 2. The array is formed by growing an elongated epitaxial strip 14 and depositing a series of metal strips 16 in the same manner as disclosed above. The remainer of the procedure for forming the array of detectors in the same.

It is well known that majority carrier injection across Schottky barriers is partially governed by diffusion and partially by therminoic (field) emission. However, the Indium-epitaxial crystalline layer may not be an abrupt metal-semiconductor contact at all. The low temperature optical band gap of $Pb_{0.8}Sn_{0.2}Te$ is of course, also expected to be of 0.1eV, barring major effects from a Burstein Shift in this material. This correlation with the activation energy of responsivity might be interpreted to imply that the zero bias resistance is simply proportional to the inverse square of the intrinsic carrier density. In that case, the potential distribution and conduction mechanism of the contact would be more like that of a classical p-n junction with diffusion limited reverse saturation current. The reverse bias current of a Schottky barrier should be voltage dependent due to barrier lowering by the applied electrical field. Embodiments made according to the teachings of the present process show this general behavior - a gradual increase of reverse current with reverse voltage. These junctions probably contain leakage current paths, not only along the periphery but also through patches in the general area of the contact and hence the current-voltage characteristics may not be ideal.

The advantage of the method of the preferred embodiment is that it renders a durable and simply constructed device for detecting infrared radiation in the 8 to 14 micron wavelength region. A minimum number of steps are required to produce the infrared detector or detector array which is assured to have a high quality surface at the metal-semiconductor Schottky barrier layer.

Obviously, many modifications and variations of the present invention are possible in light of the above teachings. For example, different configurations in the geometry of the epitaxial films and metal layers could be used. Also, metals other than indium (In) could be used. Also, other thermally conducting and electrically insulating crystalline substrates of a material having a face-centered cubic lattice with the spacing between atoms equal to that of the epitaxial crystalline layer and a coefficient of thermal expansion approximately matched (i.e., the coefficient of thermal expansion of the epitaxial crystalline film substantially equal to that of the substrate at the higher temperatures, but differing approximately by a factor of 2° at 77° Absolute) to that of the epitaxial crystalline layer could be used, such as sodium chloride (NaCl) or cesium bromide (CsBr), cesium chloride (CsCl), cesium fluoride (CsF), potassium chloride (KCl), lithium fluoride (LiF), barium fluoride ($BaF_2$), strontium fluoride ($SrF_2$), calcium fluoride ($CaF_2$), or calcium fluoride ($CaF_2$).

Also other protective and electrically insulating layers could be used in place of $SiO_2$ such as magnesium fluoride ($MgF_2$), calcium fluoride ($CaF_2$) or aluminum oxide ($Al_2O_3$).

It is therefore to be understood that within the scope of the appended claims the invention may be practiced otherwise than as specifically described.

What is claimed as new and desired to be secured by Letters Patent of the United States is:

1. A method for forming a photovoltaic, epitaxial film, metal contact radiation detector for detecting radiation having wavelengths ranging from 8 to 14 microns comprising the steps of:
    depositing an epitaxial crystalline layer selected from the group consisting of:
    $Pb_{1-x}Sn_xTe$,
    $Pb_{1-x}Sn_xSe$, and
    mixtures thereof
by the quasiequilibrium method on a thermally conducting, electrically insulating crystalline substrate of a material having a face-entered cubic lattice with spacing between atoms equal to that of said epitaxial crystalline layer and having a coefficient of thermal expansion approximately equal to that of said epitaxial crystalline layer wherein x is a quantity having an appropriate value for detecting electromagnetic radiation having wavelengths ranging from 8 to 14 microns;
    thermally evaporating a strip of metal over at least a portion of said epitaxial crystalline layer without exposing said epitaxial crystalline layer to ambient gases so as to form a rectifying metal-semiconductor contact;
    thermally evaporating a protective electrically insulating layer over said metal-semiconductor contact without exposing said metal-semiconductor to ambient gases;
    bonding said crystalline subtrate to a heat sink.

2. The method of claim 1 wherein said step of bonding comprises bonding to said heat sink in such a manner as to form a reflective surface between said substrate and said heat sink.

3. The method of claim 1 wherein said step of thermally evaporating a strip of metal comprises thermally evaporating indium (In) metal.

4. The method of claim 1 wherein said step of thermally evaporating a strip of metal comprises thermally evaporating lead (Pb) metal.

5. The method of claim 1 wherein said step of depositing an epitaxial crystalline layer on a crystalline substrate comprises depositing said layer on a crystalline substrate of $BaF_2$.

6. The method of claim 1 wherein said step of depositing an epitaxial crystalline layer on a crystalline substrate comprises depositing said layer on a crystalline substrate of sodium chloride(NaCl).

7. The method of claim 1 wherein said step of depositing an epitaxial crystalline layer on a crystalline substrate comprises depositing said layer on a crystalline substrate of cesium bromide(CsBr).

8. The method of claim 1 wherein said step of depositing an epitaxial crystalline layer on a crystalline substrate comprises depositing said layer on a crystalline substrate of calcium fluoride($CaF_2$).

9. The method of claim 1 wherein said step of thermally evaporating a protective, electrically insulating layer comprises evaporating a protective, electrically insulating layer of silicon dioxide($SiO_2$).

10. The method of claim 1 wherein said step of thermally evaporating a protective, electrically insulating layer comprises evaporating a protective, electrically insulating layer of magnesium fluoride($MgF_2$).

11. The method of claim 1 wherein said step of thermally evaporating a protective, electrically insulating layer comprises evaporating a protective, electrically insulating layer of calcium fluoride($CaF_2$).

12. The method of claim 1 wherein said step of thermally evaporating a protective, electrically insulating layer comprises evaporating a protective, electrically insulating layer of aluminum oxide($Al_2O_3$).

13. The method of claim 1 wherein said step of depositing an epitaxial layer comprises depositing an epitaxial layer of lead tin telluride($Pb_{1-x}Sn_xTe$).

14. The method of claim 1 wherein said step of depositing an epitaxial layer comprises depositing an epitaxial layer of lead tin selenide($Pb_{1-x}Sn_xSe$).

15. A method for forming a photovoltiac, epitaxial film, metal contact radiation detector for detecting radiation having wavelengths ranging from 8 to 14 microns comprising the steps of:

depositing an epitaxial crystalline layer selected from the group consisting of:
$Pb_{1-x} Sn_x Te$,
$Pb_{1-x} Sn_x Se$, and
mixtures thereof by the quasiequilibrium method on a crystalline substrate selected from the group consisting of:
lithium fluoride (LiF),
sodium chloride (NaCl),
potassium chloride (KCl),
cesium fluoride (CsF),
cesium chloride (CsCl),
cesium bromide (CsBr),
calcium fluoride ($CaF_2$),
strontium fluoride ($SrF_2$), and
barium fluoride ($BaF_2$), wherein $x$ is a quantity having an appropriate value for detecting electromagnetic radiation having wavelengths ranging from 8 to 14 microns;

thermally evaporating a strip of metal over at least a portion of said epitaxial crystalline layer without exposing said epitaxial crystalline layer to ambient gases so as to form a rectifying metal-semiconductor contact;

thermally evaporating a protective electrically insulating layer over said metal semiconductor contact without exposing said metal-semiconductor to ambient gases;

bonding said crystalline substrate to a heat sink.

* * * * *